United States Patent
Chan et al.

(10) Patent No.: US 9,705,531 B2
(45) Date of Patent: Jul. 11, 2017

(54) MULTI MODE VITERBI DECODER

(71) Applicant: eTopus Technology Inc., Sunnyvale, CA (US)

(72) Inventors: Kai Keung Chan, Fremont, CA (US); Yu Kou, San Jose, CA (US); Tze Yin Cheung, Hong Kong (HK); Danfeng Xu, Cupertino, CA (US)

(73) Assignee: eTopus Technology Inc., Sunnyvale, CA (US)

( * ) Notice: Subject to any disclaimer, the term of this patent is extended or adjusted under 35 U.S.C. 154(b) by 156 days.

(21) Appl. No.: 14/624,872

(22) Filed: Feb. 18, 2015

(65) Prior Publication Data

US 2016/0241274 A1 Aug. 18, 2016

(51) Int. Cl.
*H03M 13/03* (2006.01)
*H03M 13/39* (2006.01)
*H03M 13/41* (2006.01)
*H03M 13/00* (2006.01)

(52) U.S. Cl.
CPC ... *H03M 13/3961* (2013.01); *H03M 13/4107* (2013.01); *H03M 13/4161* (2013.01); *H03M 13/6508* (2013.01)

(58) Field of Classification Search
CPC ......... H03M 13/4161; H03M 13/4107; H03M 13/6516; H03M 13/6519; H03M 13/3961; H03M 13/6502; H03M 13/6505; H03M 13/41; H03M 13/4169
See application file for complete search history.

(56) References Cited

U.S. PATENT DOCUMENTS

| | | | | |
|---|---|---|---|---|
| 6,148,431 A | * | 11/2000 | Lee | H03M 13/3961 375/341 |
| 6,553,541 B1 | * | 4/2003 | Nikolic | G11B 20/10 360/40 |
| 2004/0153958 A1 | | 8/2004 | Steinert | |
| 2004/0243908 A1 | * | 12/2004 | Box | H03M 7/40 714/759 |
| 2006/0195773 A1 | * | 8/2006 | Pisek | H03M 13/41 714/795 |
| 2007/0183539 A1 | * | 8/2007 | Nishijima | H03M 13/3961 375/341 |

(Continued)

OTHER PUBLICATIONS

PCT International Search Report and Written Opinion, PCT Application No. PCT/US16/18127, May 6, 2016, 14 pages.

*Primary Examiner* — David Ton
(74) *Attorney, Agent, or Firm* — Fenwick & West LLP

(57) ABSTRACT

A multi-mode viterbi decoder supporting different decoding modes. The viterbi decoder comprises circuitry to output one or more data symbol values. The circuitry sets the one or more data symbol values to a first quantity of unit intervals in a first decoding mode (e.g. PAM-4). The circuitry sets the one or more data symbol values to a second quantity of unit intervals in a second decoding mode (e.g. NRZ). The second quantity of unit intervals is greater than the first quantity of unit intervals. A branch metric circuit is adapted to, in the first decoding mode, generate a set of viterbi branch metrics based on the data symbol values for the first quantity of unit intervals. The branch metric circuit is adapted to, in the second decoding mode, generate the set of viterbi branch metrics based on the data symbol values for the second quantity of unit intervals.

20 Claims, 9 Drawing Sheets

(56) References Cited

U.S. PATENT DOCUMENTS

| | | |
|---|---|---|
| 2009/0106541 A1 | 4/2009 | Mizuno et al. |
| 2009/0135946 A1 | 5/2009 | Dowling et al. |
| 2010/0229076 A1 | 9/2010 | Shinagawa et al. |
| 2012/0275784 A1 | 11/2012 | Soto et al. |
| 2013/0198594 A1 | 8/2013 | Catthoor et al. |
| 2014/0334487 A1 | 11/2014 | Choi et al. |

* cited by examiner

MULTI MODE VITERBI DECODER

BACKGROUND

1. Field of the Disclosure

The present disclosure relates to viterbi decoding and, more specifically, to a viterbi decoder supporting multiple decoding modes.

2. Description of the Related Art

In high speed communication systems, a transmitting device transmits data across a high speed communication channel to a receiving device using a signaling scheme such as two level Non Return to Zero (NRZ) signaling. The receiving device receives an analog signal from the communication channel that represents the transmitted data. As data rata requirements increase, future communication systems may use multi-level Pulse Amplitude Modulation (PAM) signaling instead of or in addition to NRZ. However, the complex circuitry needed to handle both PAM and NRZ signaling tends to increase both the size and the power of the receiving device.

SUMMARY

Embodiments of the present disclosure include a viterbi decoder that operates in different decoding modes. In one embodiment, the viterbi decoder comprises circuitry to output one or more data symbol values. The circuitry sets the one or more data symbol values to a first quantity of unit intervals in a first decoding mode (e.g. PAM-4). The circuitry sets the one or more data symbol values to a second quantity of unit intervals in a second decoding mode (e.g. NRZ). The second quantity of unit intervals is greater than the first quantity of unit intervals. A branch metric circuit is adapted to, in the first decoding mode, generate a set of viterbi branch metrics based on the data symbol values for the first quantity of unit intervals. The branch metric circuit is adapted to, in the second decoding mode, generate the set of viterbi branch metrics based on the data symbol values for the second quantity of unit intervals. A path metric circuit generates viterbi path metrics based on the set of viterbi branch metrics.

In one embodiment, a method of operation in the viterbi decoder is disclosed. The method comprises: in a first decoding mode: setting one or more data symbol values to a first quantity of unit intervals; and generating a set of viterbi branch metrics with a branch metric circuit based on the data symbol values for the first quantity of unit intervals. The method also comprises in a second decoding mode: setting the one or more data symbol values to a second quantity of unit intervals, the second quantity of unit intervals being greater than the first quantity of unit intervals; and generating the set of viterbi branch metrics with the branch metric circuit based on the data symbol values for the second quantity of unit intervals. The method further comprises generating viterbi path metrics based on the set of viterbi branch metrics in both the first decoding mode and the second decoding mode.

In another embodiment, a viterbi decoder, comprises a path metric circuit to generate viterbi path metrics based on a set of viterbi branch metrics. A branch metric circuit generates the set of viterbi branch metrics, the branch metric circuit supporting a first decoding mode and a second decoding mode. The branch metric circuit comprises a first branch metric stage to generate a set of first candidate branch metrics based on one or more data symbols values and branch target values; a second branch metric stage to combine pairs of the first candidate branch metrics into a set of second candidate branch metrics; and a metric selection circuit to select the set of first candidate branch metrics as the set of viterbi branch metrics in the first decoding mode and to select the second candidate branch metrics as the set of viterbi branch metrics in the second decoding mode.

In another embodiment, a method of operation in a viterbi decoder is disclosed. The method comprises generating a set of candidate branch metrics based on one or more data symbol values by: generating a set of first candidate branch metrics based on one or more data symbols values and branch target values; combining pairs of the first candidate branch metrics into a set of second candidate branch metrics; and selecting the set of first candidate branch metrics as the set of viterbi branch metrics in a first decoding mode and to selecting the second candidate branch metrics as the set of viterbi branch metrics in the second decoding mode. The method further comprises generating viterbi path metrics based on the set of viterbi branch metrics.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present disclosure can be readily understood by considering the following detailed description in conjunction with the accompanying drawings.

Figure (FIG. 1 is a high speed communication system that includes a receiver, according to an embodiment.

DETAILED DESCRIPTION OF EMBODIMENTS

The Figures (FIG.) and the following description relate to preferred embodiments of the present disclosure by way of illustration only. Reference will now be made in detail to several embodiments of the present disclosure, examples of which are illustrated in the accompanying figures. It is noted that wherever practicable similar or like reference numbers may be used in the figures and may indicate similar or like functionality. One skilled in the art will readily recognize from the following description that alternative embodiments of the structures and methods illustrated herein may be employed without departing from the principles of the disclosure described herein.

Embodiments of the present disclosure include a receiver with a multi-mode viterbi decoder. The viterbi decoder can decode different signaling types (e.g. both NRZ and PAM-4), thereby minimizing the size of the viterbi decoder while still supporting multiple signaling types. Conceptually speaking, the viterbi decoder re-uses a PAM-4 trellis for NRZ decoding, which is implemented in hardware by sharing of a branch metric unit, path metric unit and trace back unit. In other embodiments, the concepts described herein may be applied to signaling types other than NRZ and PAM-4.

Figure 1:
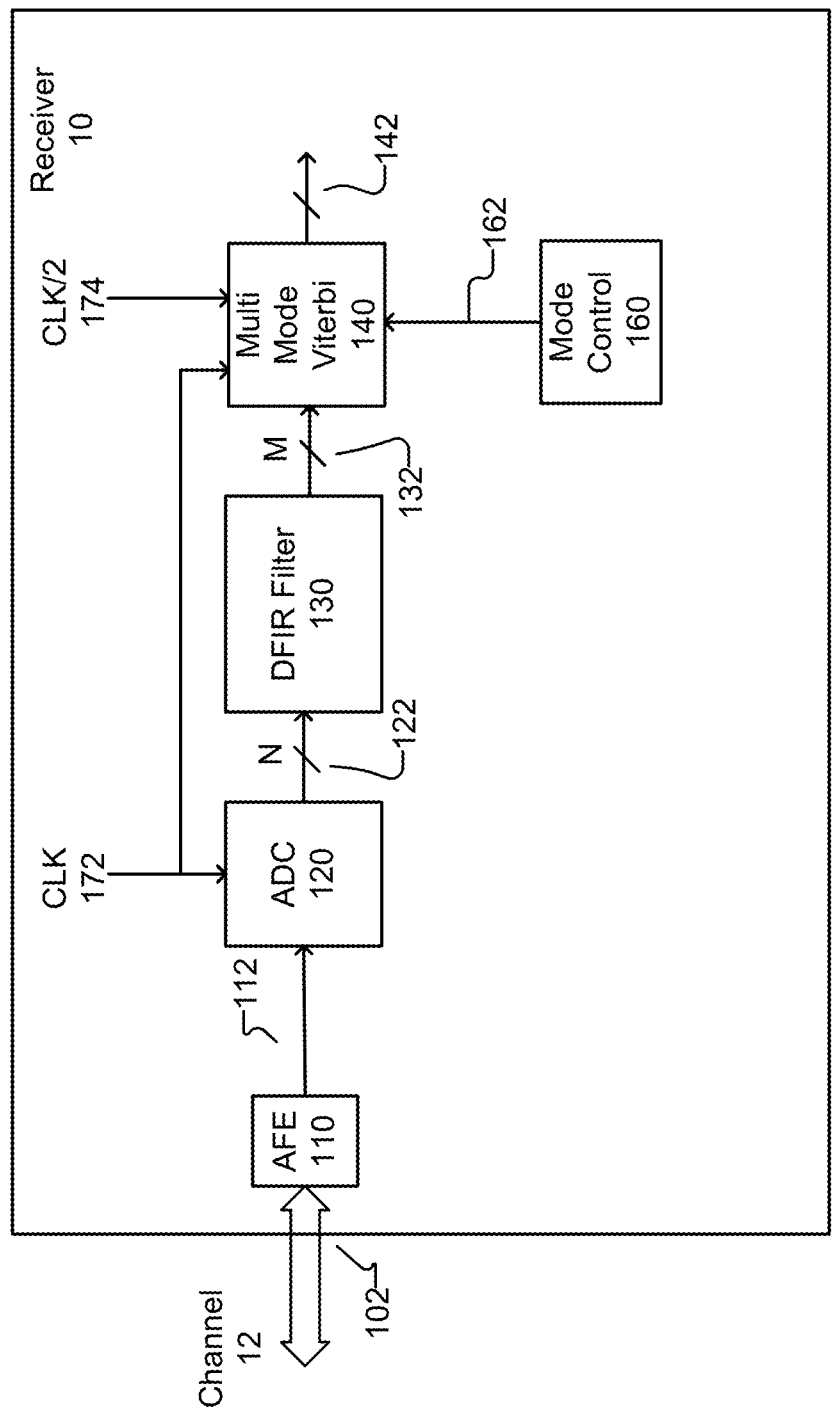

FIG. 1 is a high speed communication system that includes a receiver 10, according to an embodiment. The receiver 10 is coupled to a communications channel 12 and receives an analog channel signal 102 from a remote transmitter (not shown) through the communications channel 12. The communications channel 12 can be, for example, a copper communication channel found in a computing backplane that carries single ended or differential signals. The communications channel 12 can also be, for example, an optical communication channel that carries optical signals.

The channel signal 102 is generated at the transmitter from digital data. The channel signal 102 may be generated using one of several different signaling techniques, such as NRZ or PAM. NRZ represents 1 bit per symbol by encoding a data bit using either a high voltage or a low voltage. PAM represents N bits (N>=2) per symbol by encoding the data bits into more than two voltage levels, such as $2^N$ possible voltage levels. For example, in PAM-4 signaling, the voltage level of a signal can represents data bits of 00, 01, 10 or 11. In other embodiments such as PAM-5, there may be five possible voltage levels instead of $2^N$ voltage levels.

The receiver 10 recovers digital data 142 from the channel signal 102. In some embodiments the receiver 10 may be a standalone device or part of a larger device, such as an application specific integrated circuit (ASIC). The receiver 10 includes an analog front end (AFE) 110, an analog to digital converter (ADC) 120, a digital finite impulse response (DFIR) equalizer 130, a multi-mode viterbi decoder 140, and a mode control circuit 160. Each of these components can be implemented with hardware circuits that generate signals, and the lines connecting the components carry signals from one component to the next.

The AFE 110 includes signal conditioning circuitry that uses analog processing techniques to generate an analog input signal 112. The channel signal 102 may be non-ideal due to channel impairments, such as insertion loss, crosstalk, inter-symbol interference and optical dispersion, and the AFE 110 uses analog processing to reduce some of these non-idealities. Examples of circuitry in the AFE 110 include variable gain amplifier or continuous time equalization filters. In other embodiments the AFE 110 may simply be an input terminal that receives the channel signal 102 and passes it on to generate the analog input signal with no signal processing.

The input of ADC 120 is coupled to the output of the AFE 110. The ADC 120 converts analog input signal 112 into one or more digital input signals 122 by sampling the analog input signal 112. The sampling frequency is controlled by and matches that of the clock signal 172. The sampling frequency is typically the same as the symbol rate of the input signal 112 such that each sample represents a different data symbol. The analog samples are then rounded or quantized to their closest digital value.

The input of digital finite impulse response (DFIR) filter 130 is coupled to the output of the ADC 120. The DFIR 130 receives the digital input signals 122 and filters the digital input signals 122 into filtered digital input signals 132. DFIR filter 130 is a filter whose impulse response has finite duration. The DFIR filter 130 produces filtered digital input signals 132 having values that are equal to a weighted sum of delayed values of digital input signals 122. The DFIR filter 130 can include a number of taps, where each tap represents a different input value of the digital input signals 122. Each tap is weighted and summed together to produce the filtered digital input signals 132. The number of taps and weights can vary depending on the tuning needs of the receiver 10.

In one embodiment, digital input signals 122 carry N bit values and filtered digital input signals 132 carry M bit values. N may be equal to or different than M. For example, both digital input signals 122 and filtered digital input signals 132 may carry 8 bit values.

The mode control circuit 160 determines a type of signaling (e.g. NRZ or PAM-4) to be decoded by the receiver 10, and outputs a mode selection signal 162 having a state that indicates whether the receiver is to operate in NRZ decoding mode or PAM-4 decoding mode. For example, the mode selection signal 162 can be in a logic high state (1) when the signaling is NRZ, and can be in a logic low state (0) when the signaling is PAM-4. In one embodiment, the type of signaling may be determined in advance through negotiations with the transmitting device. In another embodiment, the type of signaling may be set by a user of the receiver 10.

The input of viterbi decoder 140 is coupled to the output of the DFIR filter 130. The viterbi decoder 140 receives the filtered digital input signals 132 and uses a viterbi algorithm to recover data from the filtered digital input signals 132. The viterbi algorithm is a maximum likelihood algorithm for decoding convolution codes.

The values of signals 132 can represent NRZ or PAM-4 symbol values, depending on whether NRZ or PAM-4 signaling was used by the transmitting device to generate the channel signal 12. The viterbi decoder 140 also operates in different viterbi decoding modes under the control of the mode selection signal 162. In an NRZ decoding mode, the viterbi decoder 140 generally operates under control of half speed clock 174 and decodes values for two consecutive NRZ symbols at a time. In PAM-4 decoding mode, the viterbi decoder 140 generally operates under control of the full speed clock 172 and decodes a value for one PAM-4 symbol at a time. The viterbi decoder 140 thus supports multiple decoding modes (e.g. NRZ and PAM-4), which allows the receiver 10 to support both NRZ and PAM-4 signaling without needing to reserve chip space for two separate viterbi decoders.

Figure 2:
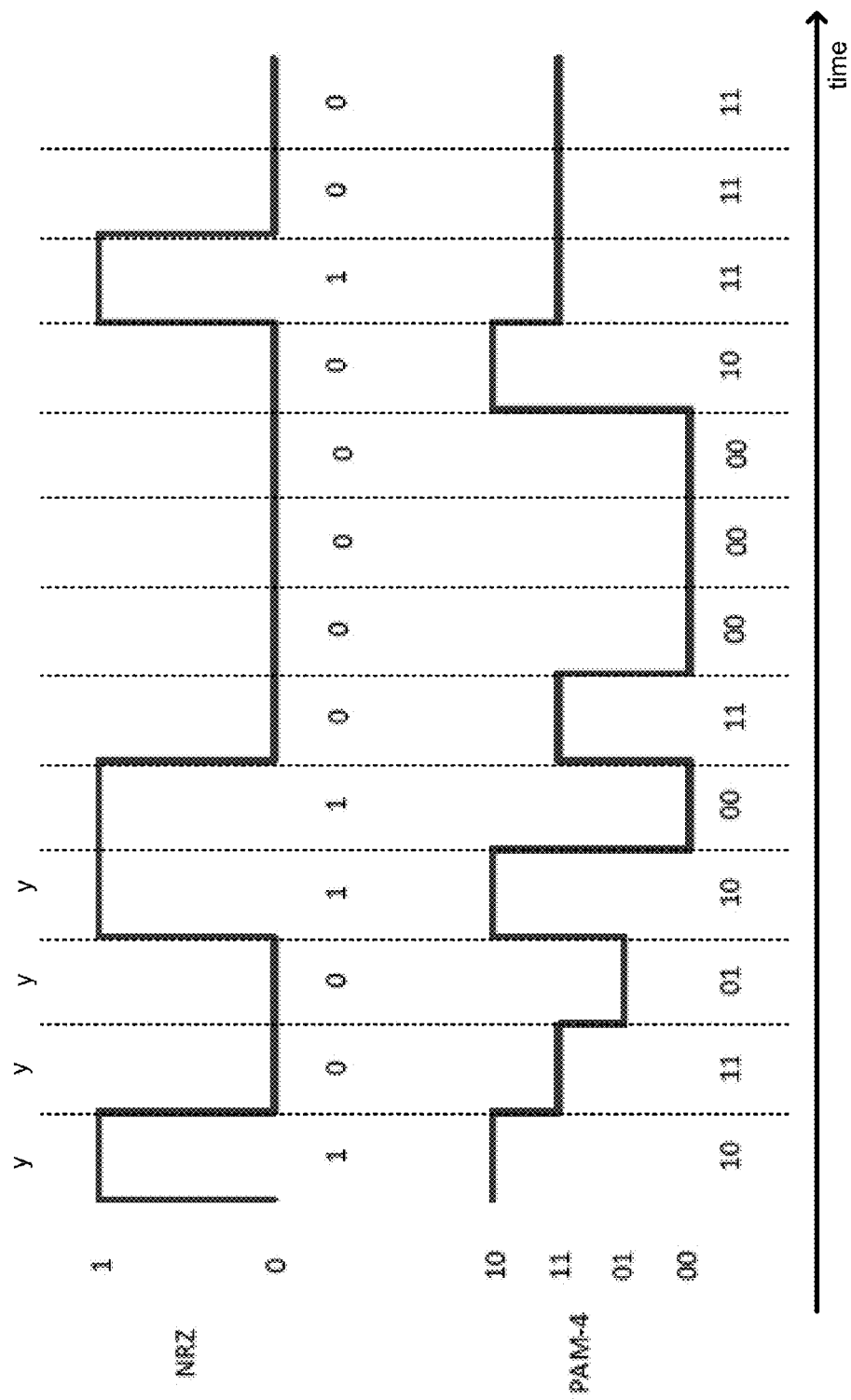
FIG. 2 includes illustrations of NRZ and PAM-4 signaling, according to an embodiment.

FIG. 2 includes illustrations of NRZ and PAM-4 signaling, according to an embodiment. The top waveform shows different data symbols for NRZ signaling, and the bottom waveform shows different data symbols for PAM-4 signaling. The data symbols (y) are separated by the dashed lines. A data symbol represents the state of the carrier at a given time and typically has a specific phase, magnitude, and frequency. The rate at which the carrier changes state from one symbol to the next is the symbol rate. Each data symbol has a symbol duration time, also known as a unit interval of a symbol. The unit interval is inversely proportional to the symbol rate.

In NRZ signaling, each data symbol represents a single data bit (1 or 0). In PAM-4 signaling, each data symbol represents multiple data bits (00, 01, 10 or 11). There are thirteen different unit intervals for thirteen different NRZ or PAM-4 symbols shown in FIG. 2. Assuming that the symbol rate is the same, PAM-4 signaling results in double the data rate of NRZ signaling.

During PAM-4 decoding mode, the viterbi decoder 140 uses the value for one PAM-4 data symbol in a single unit interval at a time to compute a set of sixteen viterbi branch metrics. The viterbi decoder 140 operates at full speed (i.e. at the symbol rate) during PAM-4 decoding mode. During NRZ decoding mode, the viterbi decoder 140 uses values for two consecutive NRZ data symbols for two consecutive unit intervals at a time to compute a set of sixteen viterbi branch metrics. The viterbi decoder 140 operates at half speed (i.e. at half the symbol rate) during NRZ decoding mode.

Figure 3:
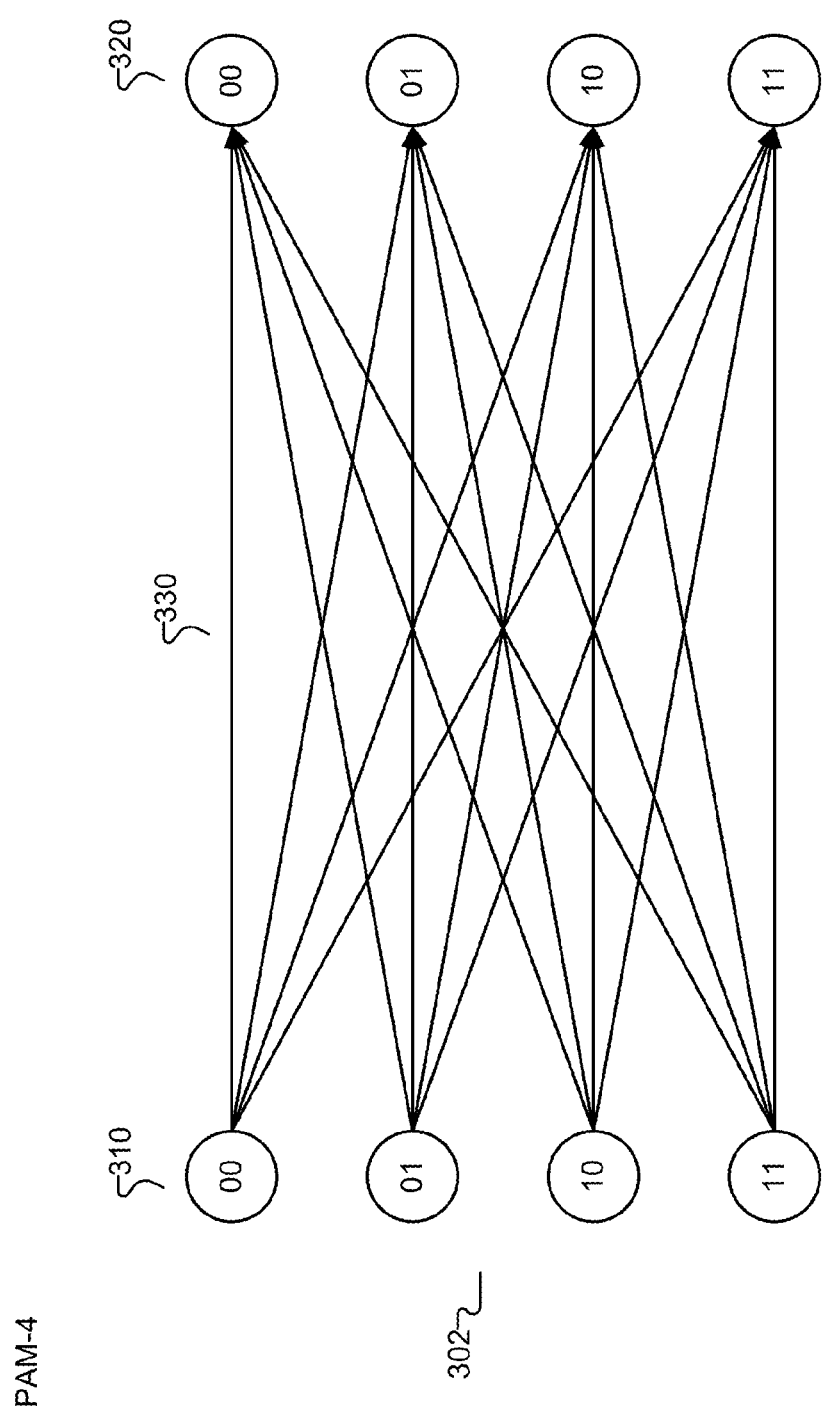
FIG. 3 is a segment of a viterbi trellis for decoding PAM-4 symbols, according to an embodiment.

FIG. 3 is a segment of a viterbi trellis 302 for decoding PAM-4 symbols, according to an embodiment. The viterbi trellis 302 includes four previous states 310, four next states 320, and sixteen branches 330 that represent possible transitions between the states. The viterbi trellis 302 is a fully connected trellis as each of the previous states 310 has a branch to each of the next states 320.

During viterbi decoding, sixteen branch metrics are computed, one for each branch 330. A branch metric is a measure of likelihood of a transition along a given branch between a previous state 310 and a next state 320. The branch metrics are computed by subtracting branch target values from a symbol value. A branch target value is the predicted value for a symbol if the branch corresponding to the branch target value is the correct transition. The branch metrics are then used to compute path metrics representing the most likely path through the trellis 302. The viterbi trellis 302 is a fully connected trellis as each of the previous states 310 has a branch to each of the next states 320.

Figure 4:
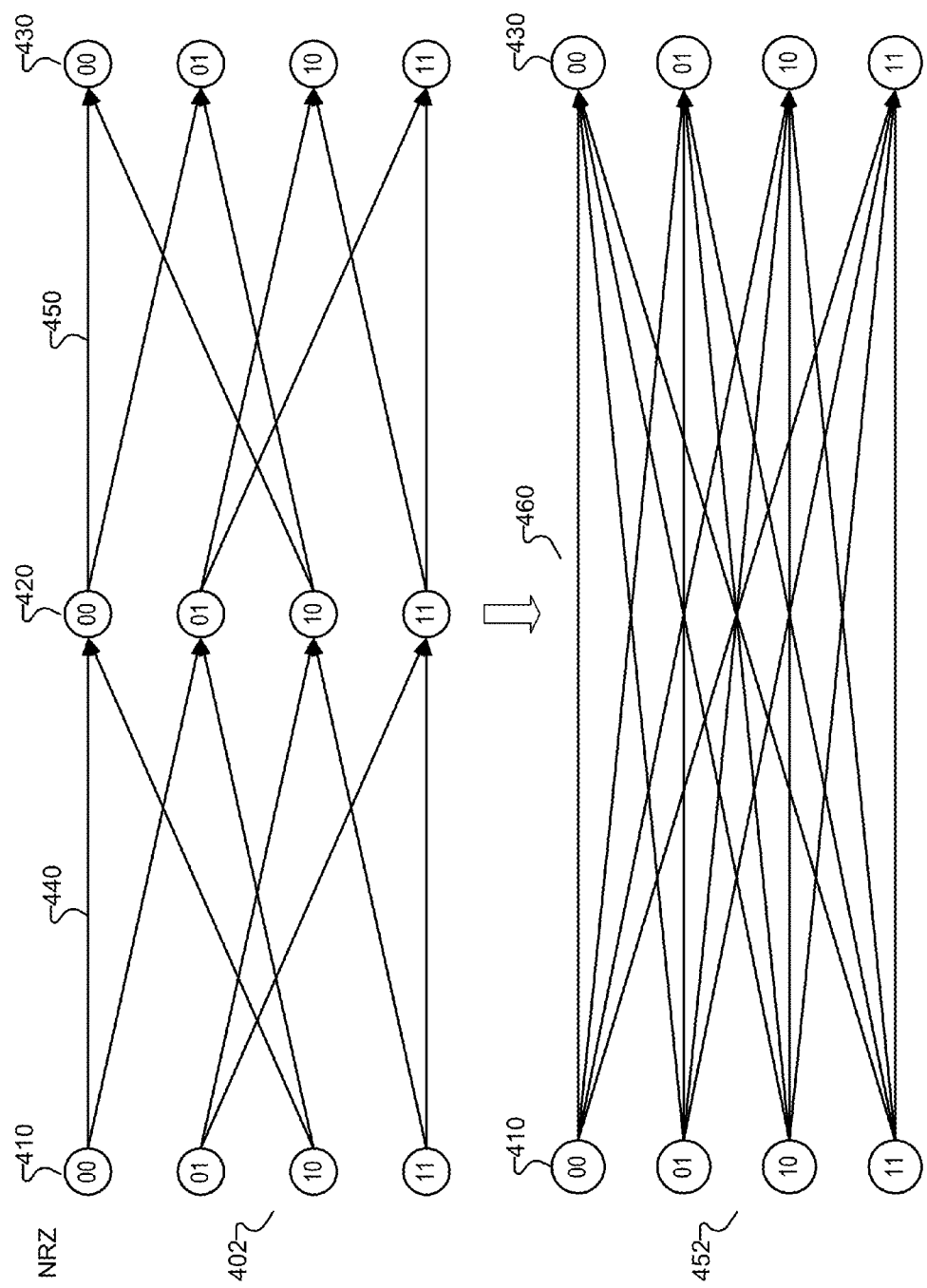
FIG. 4 illustrates how a dual stage viterbi trellis for decoding NRZ symbols can be represented as a single stage viterbi trellis, according to an embodiment.

FIG. 4 illustrates how a dual stage viterbi trellis 402 for decoding NRZ symbols can be represented as a single stage viterbi trellis 452, according to an embodiment. The top diagram is a dual stage viterbi trellis 402. The trellis 402 includes four states 410 at a first time, four states 420 at a second time, and four states 430 at a third time. The viterbi trellis 402 includes eight branches 440 between states 410 and states 420. The trellis 402 also includes eight branches 450 between states 420 and the states 430.

The dual stage viterbi trellis 402 can also be represented as a single stage viterbi trellis 452 if the intermediate states 420 are removed and branches 440 are merged with branches 450. The bottom diagram in FIG. 4 shows a single stage viterbi trellis 452 that can be used for NRZ symbol decoding. The single stage viterbi trellis 452 includes sixteen branches 460 between states 410 and 430. A viterbi decoder 140 implementing the single stage trellis 452 for decoding NRZ symbols waits until two consecutive NRZ symbol values for two unit intervals are received before computing branch metrics for branches 460. The viterbi decoder 140 thus produces branch metrics for branches 460 at half the symbol rate of incoming NRZ symbols.

The viterbi trellis 452 in FIG. 4 is identical to the viterbi trellis 302 in FIG. 3. In one embodiment, the viterbi decoder 140 implements the same trellis (e.g. 452, 302) for both NRZ and PAM-4 symbol decoding. This allows much of the circuitry in the viterbi decoder 140 to be re-used for decoding different symbol types. In PAM-4 decoding mode, the viterbi decoder 140 computes viterbi branch metrics at the same frequency as the PAM-4 symbol rate. In NRZ decoding mode, the viterbi decoder 140 computes viterbi branch metrics at half the frequency of the NRZ symbol rate.

Figure 5:
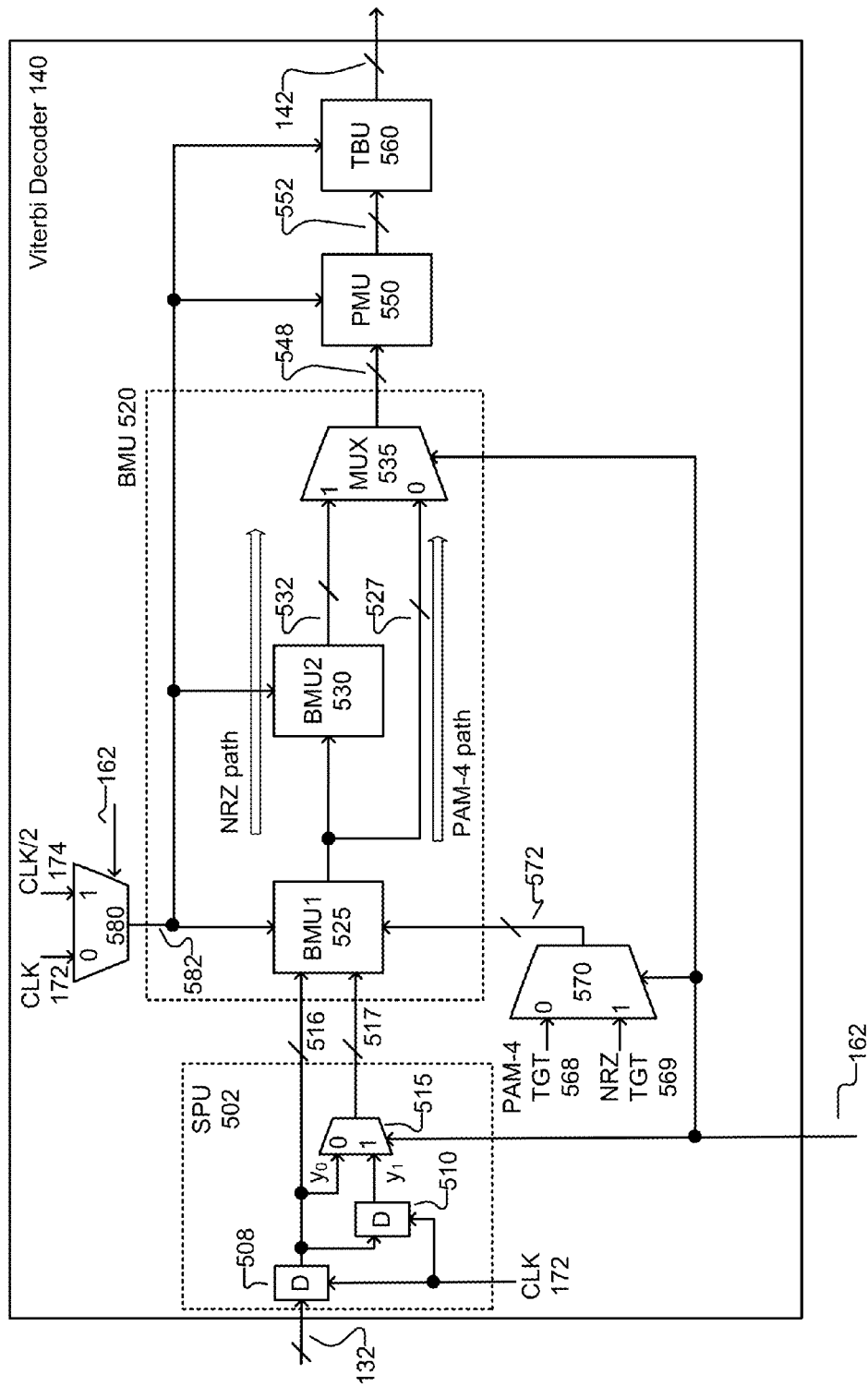
FIG. 5 is a block diagram of a viterbi decoder, according to an embodiment.

FIG. 5 is a block diagram of a viterbi decoder 140, according to an embodiment. The viterbi decoder 140 includes a symbol provisioning unit (SPU) circuit 502, clock selection multiplexer 580, branch metric unit (BMU) circuit 520, path metric unit (PMU) circuit 550, trace back unit (TBU) circuit 560, and branch target selection multiplexer 570. The components of the viterbi decoder 140 are generally implemented with circuits, and in other embodiments the viterbi decoder 140 can include additional circuits not shown in FIG. 5.

The SPU 502 receives digital signals 132. Signals 132 carry M bit (e.g. 8 bit) digital values that represent values of NRZ or PAM-4 data symbols that were sampled by ADC 120 and filtered by DFIR 130. The SPU 502 further controls the quantity of data symbols for consecutive unit intervals (e.g. 1 or 2 unit intervals) that are provided to the BMU 520 at a time. As shown, the SPU 502 includes registers 508 and 510 and symbol selection multiplexer 515.

Register 508 stores a current symbol value $y_0$ for a current unit interval. Register 510 stores a previous data symbol value $y_1$ for a previous unit interval. Registers 508 and 510 operate under control of clock signal 172. Symbol selector multiplexer 515 has two inputs. One input receives the current symbol value $y_0$ for the current unit interval and another input receives the previous symbol value $y_1$ for the previous unit interval Symbol selector multiplexer 515 selects either the current data symbol value $y_0$ or the previous data symbol value $y_1$ as its output depending on the state of the mode selection signal 162. In PAM-4 decoding mode, multiplexer 515 selects current data symbol value $y_0$ as its output. In NRZ decoding mode, multiplexer 515 selects previous data symbol value $y_1$ as its output.

Thus, in PAM-4 decoding mode, the value for one data symbol $y_0$ for a single unit interval is duplicated and provided to the BMU 520 through both signal path 516 and 517. In NRZ decoding mode, the values for two consecutive data symbols $y_0$ and $y_1$ for two different unit intervals are provided to BMU 520. The value for one data symbol $y_0$ is provided through signal path 516 and the value for another data symbol $y_1$ is provided through signal path 517. The SPU 502 therefore provides data symbol values for a greater quantity of unit intervals across signal path 516 and 517 during NRZ decoding mode than during PAM-4 decoding mode.

BMU 520 is coupled to the output of the symbol provisioning unit 502 and receives data symbol values via signal paths 516 and 517. BMU calculates a set of sixteen viterbi branch metrics 548 using the data symbol values. Each viterbi branch metric 548 corresponds to a different branch of the viterbi trellis 302 or 460 from FIG. 3 or FIG. 4. In PAM-4 decoding mode, values for a single data symbol for a single unit interval are used to compute a set of sixteen viterbi branch metrics 548. In NRZ decoding mode, values for two consecutive data symbols for two different unit intervals are used to compute the set of sixteen viterbi branch metrics 548. As shown, BMU 520 includes a first branch metric circuit stage 525 (BMU1), a second branch metric circuit stage 530 (BMU2), and a metric selection multiplexer 535.

BMU1 525 receives two data symbol values via signal paths 516 and 517. The data symbol values may represent a single PAM-4 symbol or two consecutive NRZ symbols. The first branch metric stage 525 performs sixteen branch metric calculations on the received data symbol values to produce a set of sixteen candidate branch metrics 527. The branch metric calculations are generally performed by subtracting branch target values 572 from the received data symbol values, and then squaring the resulting values. The details of BMU1 525 will be explained in greater detail by reference to FIG. 6A-6B.

BMU2 530 combines pairs of candidate branch metrics 527 to produce another set of sixteen candidate branch metrics 532. The details of BMU2 will be explained in greater detail by reference to FIG. 7.

The metric selection multiplexer 535 selects either the candidate branch metrics 527 or candidate branch metrics 532 to output as the final set of viterbi branch metrics 548. The branch metrics that are selected depend on the state of the mode selection signal 162. If the mode selection signal 162 indicates the receiver 10 is in PAM-4 decoding mode, the set of candidate branch metrics 527 are selected for output. If the mode selection signal 162 indicates the receiver 10 is in NRZ decoding mode, the set of candidate branch metrics 532 are selected for output.

Branch target selection multiplexer 570 receives PAM-4 branch target values 568 and NRZ branch target values 569 at its inputs. The branch target selection multiplexer 570 selects either the PAM-4 or NRZ branch target values to be output as branch target values 572 depending on the state of the mode selection signal 162. This causes the branch target values 572 used by BMU1 525 to be different depending whether PAM-4 or NRZ symbols are being decoded. In one embodiment, there are sixteen unique PAM-4 branch target values 568. There are eight unique NRZ branch target values 569. Branch target values are considered unique from other branch target values if they are not duplicative of the other values.

PMU 550 calculates viterbi path metrics 552 from the viterbi branch metrics 548 in both the NRZ and PAM-4 decoding modes. Path metrics 552 are accumulations of branch metrics 548 along a given path through a viterbi trellis. The PMU 550 generally uses add-compare-select (ACS) operations to calculate the viterbi path metrics 552, as will be described by reference to FIG. 8.

TBU 560 collects the path metrics 552 and identifies a maximum-likelihood path from the path metrics 552 in both the NRZ and PAM-4 decoding modes. The TBU 560 can include a first in last out (FILO) buffer to reconstruct a correct path through multiple viterbi trellis stages. TBU 560 then outputs recovered data 142 corresponding to the maximum-likelihood path.

Clock selection multiplexer 580 receives full speed clock signal 172 and half speed clock signal 174. Clock selection multiplexer 570 selects either the full speed clock signal 172 or the half speed clock signal 174 to be output as the selected clock signal 582. Registers of the BMU 520, PMU 550 and TBU 560 are clocked by and operate under control of the selected clock signal 582.

The selected clock signal depends on the state of the mode selection signal 162. In PAM-4 decoding mode, multiplexer 580 selects full speed clock signal 172, which causes BMU 520, PMU 550, and TBU 560 to operate and perform calculations at the symbol rate of the incoming PAM-4 symbols. In NRZ decoding mode, multiplexer 580 selects half speed clock signal 174, which causes BMU 520, PMU 550, and TBU 560 to operate and perform calculations at half the symbol rate of the incoming NRZ symbols.

Figure 6A:
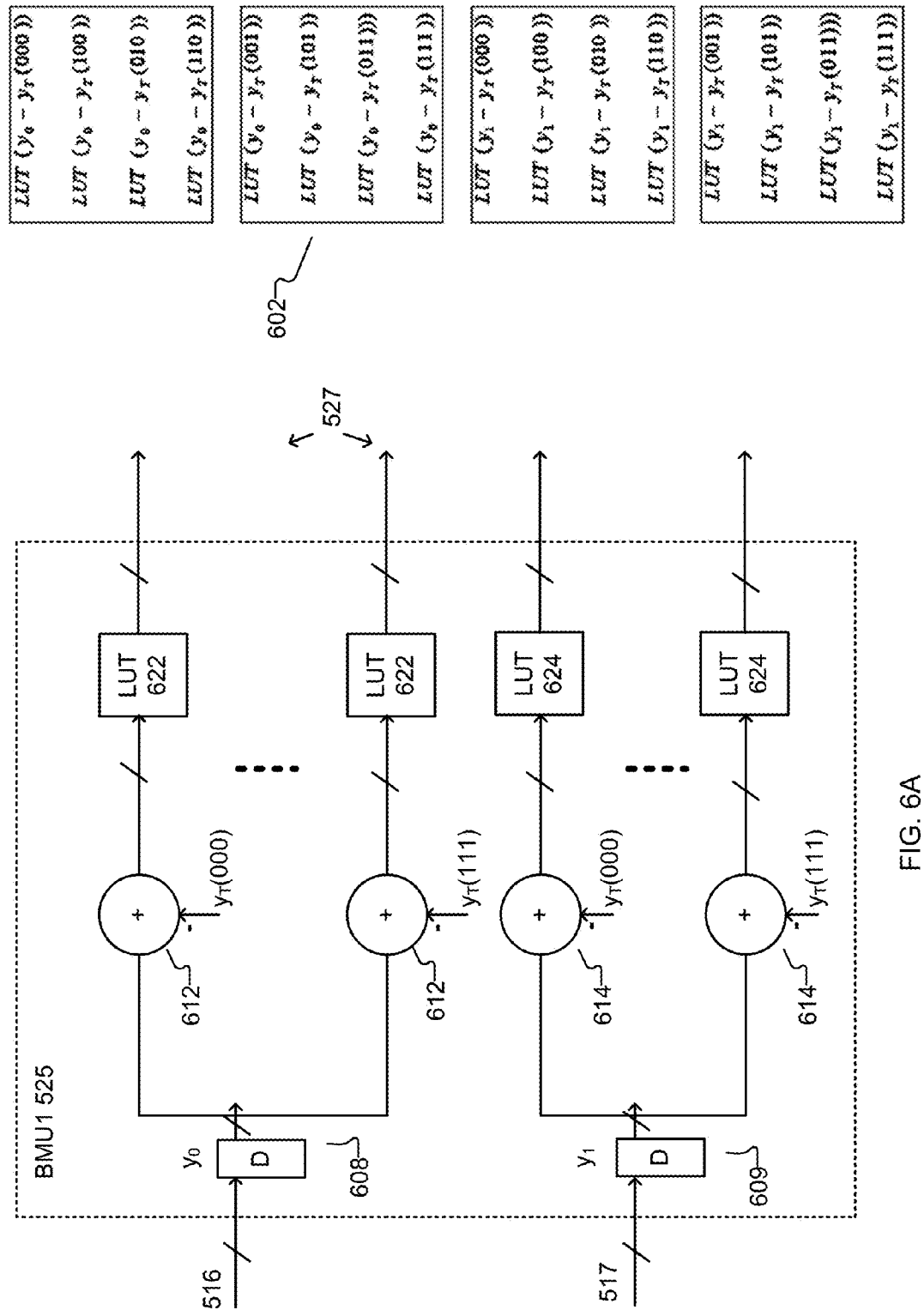
FIG. 6A illustrates the first branch metric stage and operation of the first branch metric stage during NRZ decoding mode, according to an embodiment.

FIG. 6A illustrates the first branch metric stage 525 and operation of the first branch metric stage 525 during NRZ decoding mode, according to an embodiment. $y_0$ represents a NRZ data symbol value for one unit interval. $y_1$ represents another NRZ data symbol value for another unit interval that follows $y_0$ in time. $y_T$ is a branch target value.

BMU1 525 includes a register 608 to hold a data symbol value $y_0$ and another register 609 to hold another data symbol value $y_1$. Sixteen different adder circuits 612 and 614 (only four are shown in FIG. 6a) implement sixteen subtraction operations. The first eight adder circuits 612 subtract respective branch target values $y_T(000\text{-}111)$ from data symbol value $y_0$. The second eight adder circuits 614 subtract respective branch target values $y_T(000\text{-}111)$ from data symbol value $y_1$.

The output values of the adder circuits 612 and 614 are input to look up tables (LUT) 622 and 624. The LUTs 622 and 624 include associations between input values and branch metric values. The LUTs 622 and 624 look up appropriate output values for the set of sixteen different candidate branch metrics 527. The LUTs 622 and 624 implement a pre-computed mathematical function, such as a squaring of an input value to produce an output value. The resulting set of sixteen candidate branch metrics 527 represent branch metrics for branches 440 and 450 in the two stage trellis 402 of FIG. 4.

A list of the sixteen calculations 602 performed by the BMU1 525 to produce branch metrics 527 during NRZ decoding mode is reproduced on the right side of FIG. 6A. During NRZ decoding mode, the branch metric unit 525 uses eight unique branch target values $y_T(000)$ through $y_T(111)$ in the branch metric calculations 602. The branch target values can be set to pre-determined values that are different from each other. The branch target values may also be adjusted in real time depending on channel characteristics.

Figure 6B:
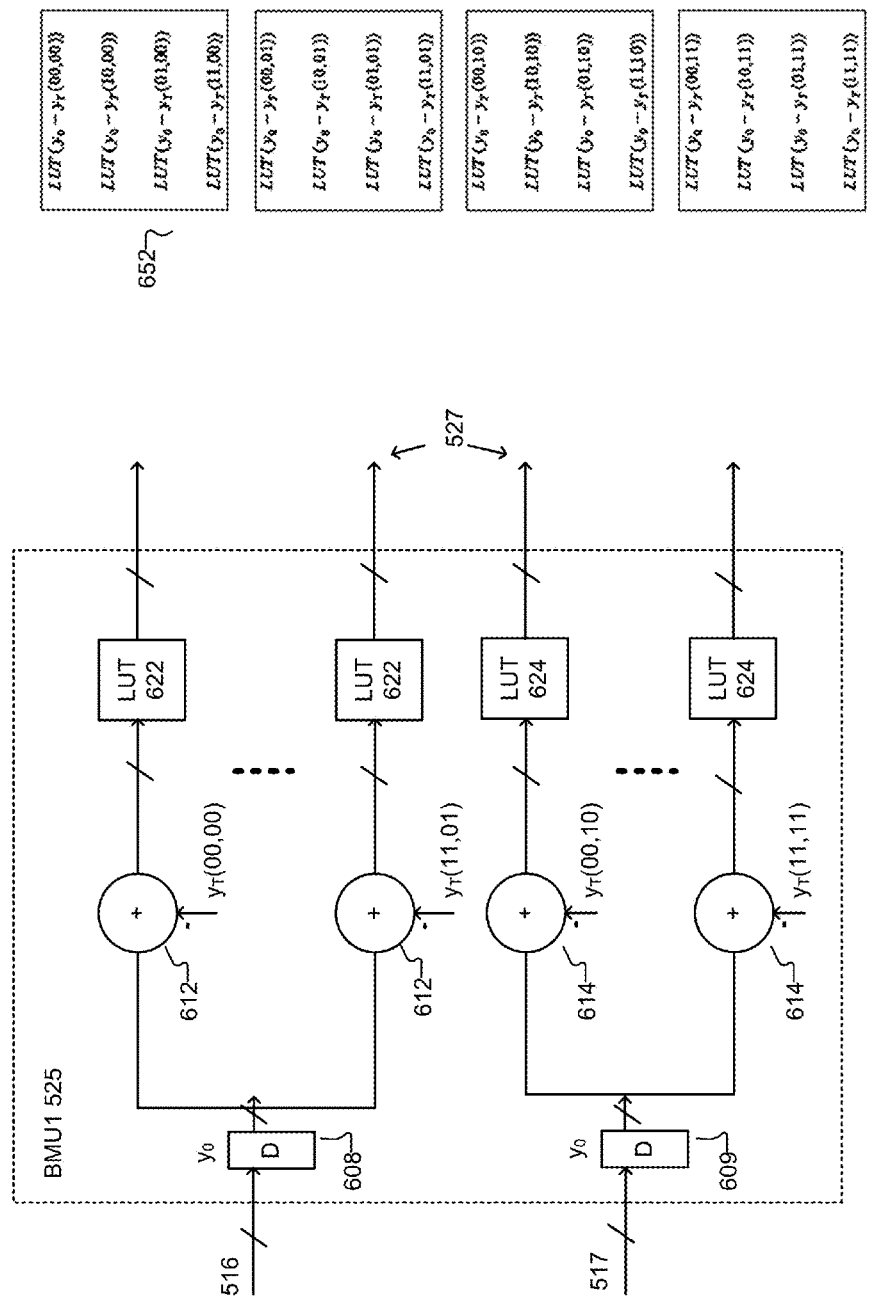
FIG. 6B illustrates the first branch metric stage and operation of the first branch metric stage during PAM-4 decoding mode, according to an embodiment.

FIG. 6B illustrates the first branch metric stage 525 and operation of the first branch metric stage 525 during PAM-4 decoding mode, according to an embodiment. The same registers 608 and 609, adder circuits 612 and 614, and look up tables 622 and 624 used for the NRZ calculations are now repurposed and used to implement PAM-4 calculations.

$y_0$ represents a PAM-4 data symbol value for a unit interval. $y_t$ is a branch target value. During PAM-4 decoding mode, both registers 608 and 609 store a data symbol value $y_0$ for the same PAM-4 data symbol. All sixteen adder circuits 612 and 614 now receive the same symbol value $y_0$. The adder circuits 612 and 614 subtract respective branch target values $y_T(00,00)\text{-}y_T(11,11)$ from data symbol value $y_0$. The LUTs 622 and 624 use the outputs of the adder circuits 612 and 614 to look up appropriate output values for the set of sixteen different candidate branch metrics 527. The resulting set of sixteen candidate branch metrics 527 represent branch metrics for each of the branches 330 in the PAM-4 viterbi trellis 302 of FIG. 3.

A list of the sixteen calculations 652 performed by the BMU1 525 to produce branch metrics 527 during PAM-4 decoding mode is on the right side of FIG. 6B. During PAM-4 decoding mode, BMU1 525 uses sixteen unique branch target values $y_T(00,00)$ through $y_T(11,11)$ in the branch metric calculations 602. The branch target values can be set to pre-determined values that are different from each other. The branch target values may also be adjusted in real time depending on channel characteristics.

Figure 7:
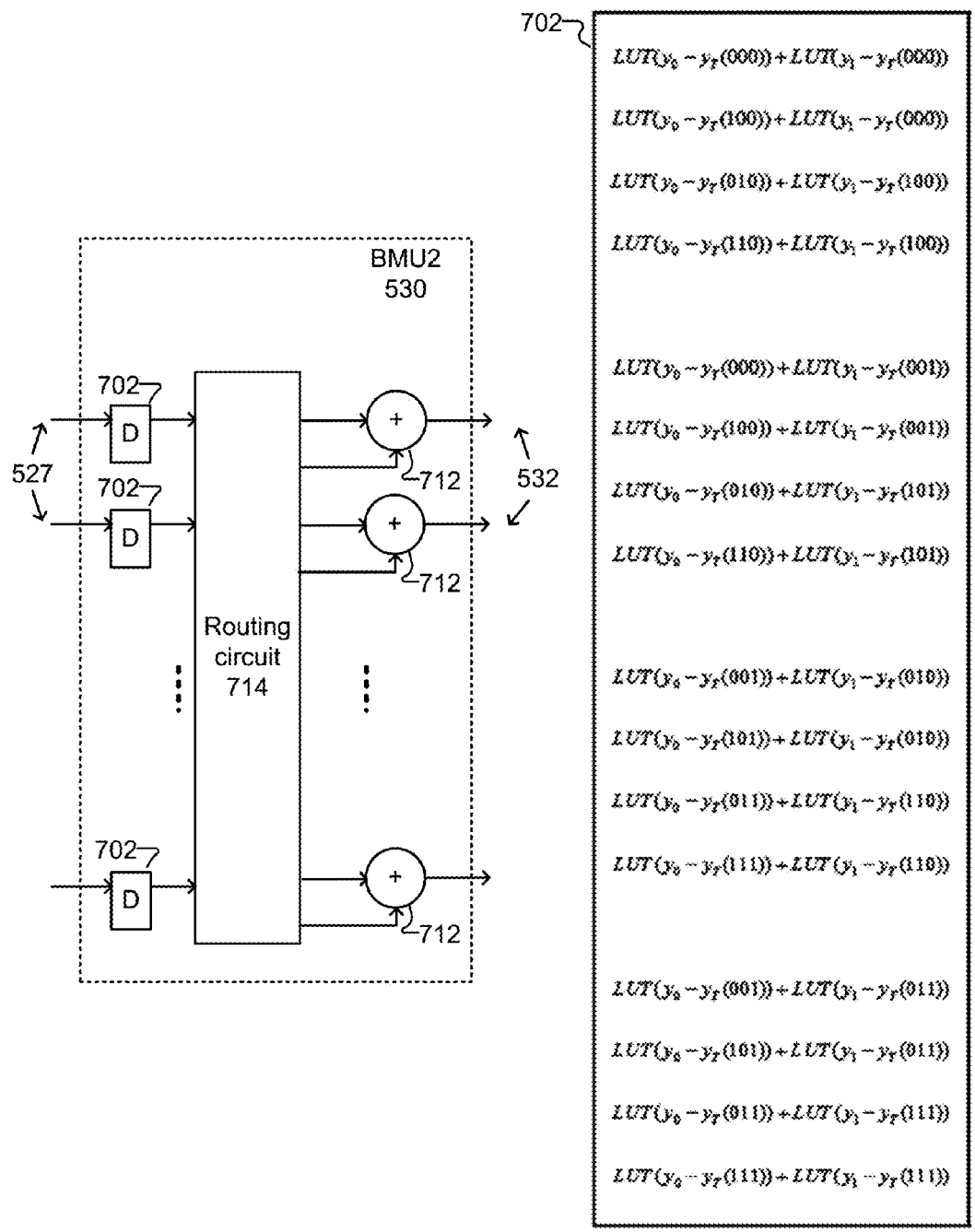
FIG. 7 illustrates a second branch metric unit, according to an embodiment.

Referring now to FIG. 7, illustrated is a second branch metric unit 530, according to an embodiment. BMU2 530 includes input registers 702, a routing circuit 714 and sixteen different adder circuits 712 (only three are shown in FIG. 7). Input registers 702 store the branch metrics 527. Routing circuit 714 routes the branch metrics 527 to the inputs of the adder circuits 712. Each adder circuit 712 combines a different pair of branch metrics 527 to generate branch metrics 532.

Together, the routing circuit 714 and adder circuits 712 implement sixteen different calculations 702. The list of calculations 702 in FIG. 7 are shown for NRZ decoding mode. Each calculation 702 is a sum of a different pair of branch metrics 527. The resulting candidate branch metrics 532 correspond to the branches 460 of viterbi trellis 452 from FIG. 4. Conceptually, BMU2 530 implements the conversion of a dual stage viterbi trellis 402 into a single stage viterbi trellis 452.

Figure 8:
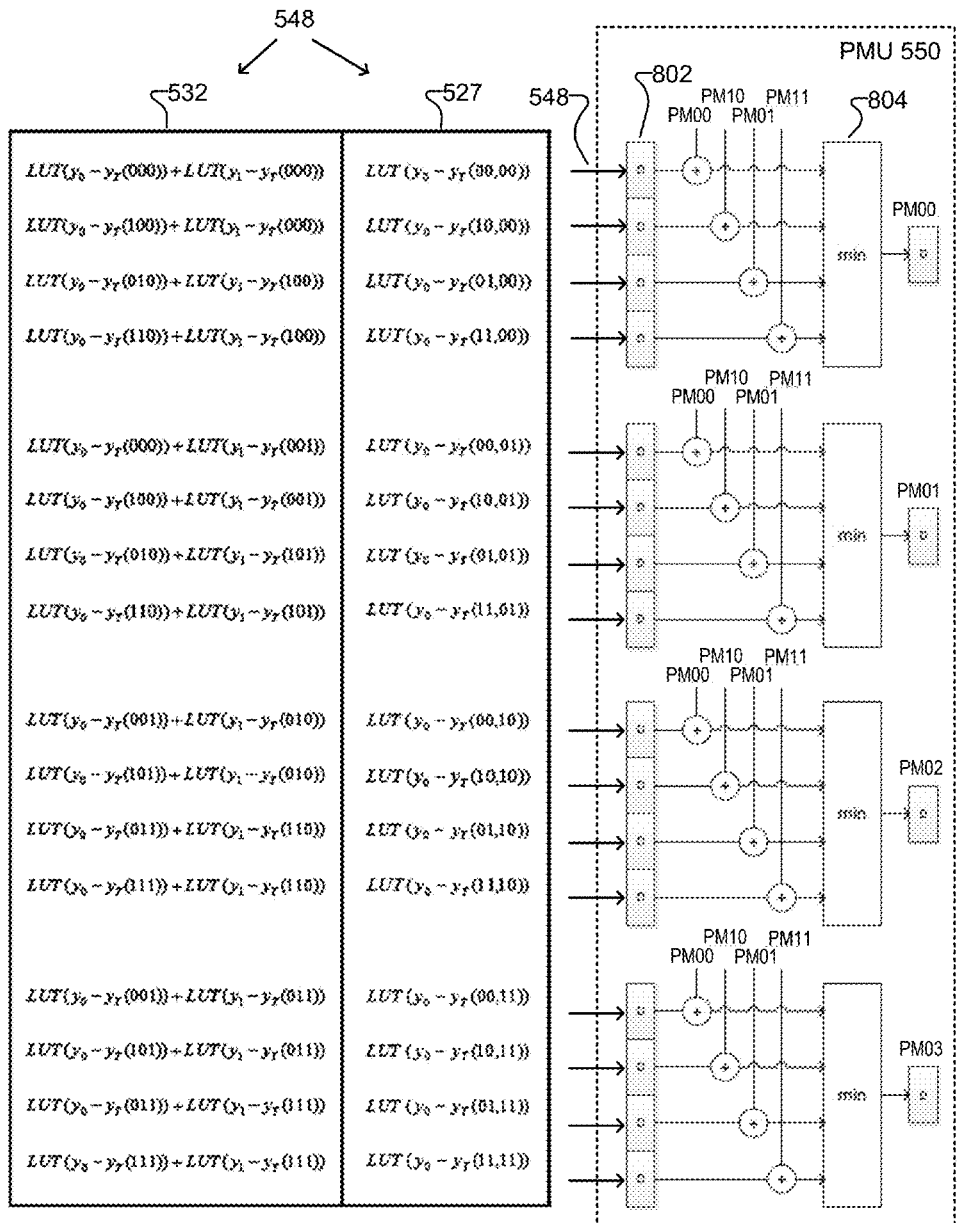
FIG. 8 illustrates the path metric unit, according to an embodiment.

FIG. 8 illustrates a path metric unit 550, according to an embodiment. The PMU 550 includes input registers 802 storing the selected viterbi branch metrics 548. The selected viterbi branch metrics 548 are candidate branch metrics 532 during PAM-4 decoding mode. The selected viterbi branch metrics are candidate branch metrics 527 during NRZ decoding mode. However, the operation of the path metric unit 550 is the same regardless of whether PAM-4 or NRZ decoding mode is being used.

The PMU 550 divides viterbi branch metrics 548 into four groups of four branch metrics 548. For each group, the viterbi branch metrics 548 are combined with previous path metrics PM00-PM03 using adder circuits to generate candidate path metrics. A minimum value selection circuit 804 compares the candidate path metrics with each other to identify the minimum of the candidate path metrics. The minimum candidate path metric is then stored in a register to update a respective path metric PM00-PM03. In this manner, four new path metrics PM00-PM03 are generated.

In one embodiment, a representation of the receiver 10 or components within the receiver 10 may be stored as data in a non-transitory computer-readable medium (e.g. hard disk drive, flash drive, optical drive). These representations may be, for example, behavioral level, register transfer level, logic component level, transistor level and layout geometry-level descriptions.

Upon reading this disclosure, those of ordinary skill in the art will appreciate still additional alternative structural and functional designs for a receiver with a multi-mode viterbi decoder through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure disclosed herein without departing from the spirit and scope of the disclosure as defined in the appended claims.

What is claimed is:

1. A viterbi decoder, comprising:
   circuitry to output one or more data symbol values, the circuitry setting the one or more data symbol values to a first quantity of unit intervals in a first decoding mode and to set the one or more data symbol values to a second quantity of unit intervals in a second decoding mode, the second quantity of unit intervals being greater than the first quantity of unit intervals;
   a branch metric circuit to, in the first decoding mode, generate a set of viterbi branch metrics based on the data symbol values for the first quantity of unit intervals, and, in the second decoding mode, generate the set of viterbi branch metrics based on the data symbol values for the second quantity of unit intervals; and
   a path metric circuit to generate viterbi path metrics based on the set of viterbi branch metrics.

2. The viterbi decoder of claim 1, wherein the branch metric circuit comprises:
   a first branch metric stage to generate a set of first candidate branch metrics based on the one or more data symbols values and branch target values;
   a second branch metric stage to combine pairs of the first candidate branch metrics into a set of second candidate branch metrics; and
   a metric selection circuit to select the set of first candidate branch metrics as the set of viterbi branch metrics in the first decoding mode and to select the second candidate branch metrics as the set of viterbi branch metrics in the second decoding mode.

3. The viterbi decoder of claim 2, wherein the first branch metric stage comprises:
   a plurality of adder circuits to combine the one or more data symbol values with the branch target values; and
   a plurality of look up tables to output values for the first candidate branch metrics based on outputs of the adder circuits.

4. The viterbi decoder of claim 1, wherein the branch metric circuit generates the set of viterbi branch metrics further based on branch target values, and the viterbi decoder further comprises:
   a branch target selection circuit to receive first branch target values and second branch target values and to select the first branch target values as the branch target values for the branch metric circuit in the first decoding mode, and to select the second branch target values as the branch target values for the branch metric circuit in the second decoding mode.

5. The viterbi decoder of claim 4, wherein there are more unique first branch target values than unique second branch target values.

6. The viterbi decoder of claim 5, wherein there are sixteen unique first branch target values and eight unique second branch target values.

7. The viterbi decoder of claim 1, wherein the circuitry outputs the one or more data symbol values along a first signaling path and a second signaling path, the first signaling path carrying a data symbol value for a common unit interval in the first decoding mode, and carrying different data symbol values for different unit intervals in the second decoding mode.

8. The viterbi decoder of claim 1, wherein the circuitry comprises:
   a register to store a previous data symbol for a previous unit interval; and
   a multiplexer to select a current data symbol for a current unit interval for one of the data symbol values in the first decoding mode and to select the previous data symbol for one of the data symbol values in the second decoding mode.

9. The viterbi decoder of claim 1, wherein the path metric circuit comprises:
   a plurality of adder circuits to combine the viterbi branch metrics with the path metrics, the path metric unit updating the path metrics based on outputs of the adder circuits.

10. The viterbi decoder of claim 1, wherein the data symbol values are non return to zero (NRZ) data symbol values in the first decoding mode and pulse amplitude modulation 4 (PAM-4) data symbol values in the second decoding mode.

11. The viterbi decoder of claim 1, wherein the first quantity of unit intervals is one unit intervals and the second quantity of unit intervals is two unit intervals.

12. The viterbi decoder of claim 1, wherein the branch metric circuit computes the set of viterbi branch metrics at a rate controlled by a clock signal, the clock signal being a first frequency in the first decoding mode and a second frequency lower than the first frequency in the second decoding mode.

13. A method of operation in a viterbi decoder comprising:
   in a first decoding mode:
      setting one or more data symbol values to a first quantity of unit intervals; and
      generating a set of viterbi branch metrics with a branch metric circuit based on the data symbol values for the first quantity of unit intervals;
   in a second decoding mode:
      setting the one or more data symbol values to a second quantity of unit intervals, the first quantity of unit intervals being less than the first quantity of unit intervals; and
      generating the set of viterbi branch metrics with the branch metric circuit based on the data symbol values for the second quantity of unit intervals; and
   generating viterbi path metrics based on the set of viterbi branch metrics in both the first decoding mode and the second decoding mode.

14. A viterbi decoder, comprising:
   a path metric circuit to generate viterbi path metrics based on a set of viterbi branch metrics; and
   a branch metric circuit to generate the set of viterbi branch metrics, the branch metric circuit supporting a first decoding mode and a second decoding mode, and comprising:
      a first branch metric stage to generate a set of first candidate branch metrics based on one or more data symbols values and branch target values;
      a second branch metric stage to combine pairs of the first candidate branch metrics into a set of second candidate branch metrics; and
      a metric selection circuit to select the set of first candidate branch metrics as the set of viterbi branch metrics in the first decoding mode and to select the second candidate branch metrics as the set of viterbi branch metrics in the second decoding mode.

15. The viterbi decoder of claim 14, wherein the first branch metric stage comprises:
   a plurality of adder circuits to combine the one or more data symbol values with the branch target values; and
   a plurality of look up tables to output values for the first candidate branch metrics based on outputs of the adder circuits.

16. The viterbi decoder of claim 14, wherein the viterbi decoder further comprises:
   a branch target selection circuit to receive first branch target values and second branch target values and to select the first branch target values as the branch target values for the first branch metric stage in the first decoding mode, and to select the second branch target values as the branch target values for the first branch metric stage in the second decoding mode.

17. The viterbi decoder of claim 14, wherein there are more unique first branch target values than unique second branch target values.

18. The viterbi decoder of claim 14, wherein the data symbol values are pulse amplitude modulation 4 (PAM-4) data symbol values in the first decoding mode and non return to zero (NRZ) data symbol values in the second decoding mode.

19. The viterbi decoder of claim 14, wherein the first quantity of unit intervals is one unit intervals and the second quantity of unit intervals is two unit intervals.

20. A method of operation in a viterbi decoder that supports a first decoding mode and a second decoding mode, the method comprising:
   generating a set of viterbi branch metrics based on one or more data symbol values by:
      generating a set of first candidate branch metrics based on the one or more data symbols values and branch target values;
      combining pairs of the first candidate branch metrics into a set of second candidate branch metrics; and
      selecting the set of first candidate branch metrics as the set of viterbi branch metrics in the first decoding mode and selecting the set of second candidate branch metrics as the set of viterbi branch metrics in the second decoding mode; and
   generating viterbi path metrics based on the set of viterbi branch metrics.

* * * * *

UNITED STATES PATENT AND TRADEMARK OFFICE
CERTIFICATE OF CORRECTION

PATENT NO. : 9,705,531 B2
APPLICATION NO. : 14/624872
DATED : July 11, 2017
INVENTOR(S) : Kai Keung Chan It is certified that error appears in the above-identified patent and that said Letters Patent is hereby corrected as shown below:

Column no: 10, Line(s): 6-7, Claim 2: replace "one or more data symbols values" with "one or more data symbol values"

Column no: 11, Line(s): 20-22, Claim 13: replace "the first quantity of unit intervals being less than the first quantity of unit intervals;" with "the second quantity of unit intervals being less than the first quantity of unit intervals;"

Column no: 12, Line(s): 34, Claim 20: replace "one or more data symbols values" with "one or more data symbol values"

Signed and Sealed this
Twelfth Day of June, 2018

Andrei Iancu
*Director of the United States Patent and Trademark Office*